United States Patent
Birang et al.

(10) Patent No.: US 7,104,875 B2
(45) Date of Patent: Sep. 12, 2006

(54) CHEMICAL MECHANICAL POLISHING APPARATUS WITH ROTATING BELT

(75) Inventors: Manoocher Birang, Los Gatos, CA (US); Lawrence M. Rosenberg, deceased, late of San Jose, CA (US); by Sandra L. Rosenberg, legal representative, San Jose, CA (US); Sasson Somekh, Los Altos Hills, CA (US); John M White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/838,689

(22) Filed: May 3, 2004

(65) Prior Publication Data

US 2004/0209559 A1 Oct. 21, 2004

Related U.S. Application Data

(63) Continuation of application No. 10/174,476, filed on Jun. 17, 2002, now Pat. No. 6,729,944, which is a continuation of application No. 09/302,570, filed on Apr. 30, 1999, now Pat. No. 6,475,070, which is a continuation-in-part of application No. 09/244,456, filed on Feb. 4, 1999, now Pat. No. 6,244,935.

(51) Int. Cl.
*B24B 21/00* (2006.01)

(52) U.S. Cl. ........................................ 451/296; 451/307

(58) Field of Classification Search ........ 451/285–288, 451/290, 296, 301, 307, 398; 438/692, 693
See application file for complete search history.

(56) References Cited

U.S. PATENT DOCUMENTS

| | | | |
|---|---|---|---|
| 4,347,689 A | 9/1982 | Hammond | |
| 4,642,943 A | 2/1987 | Taylor, Jr. | |
| 5,065,547 A | 11/1991 | Shimizu et al. | |
| 5,088,240 A | 2/1992 | Ruble et al. | |
| 5,099,615 A | 3/1992 | Ruble et al. | |
| 5,209,027 A | 5/1993 | Ishida et al. | |
| 5,220,750 A | 6/1993 | Emberland et al. | |
| 5,276,999 A | 1/1994 | Bando | |
| 5,335,453 A | 8/1994 | Baldy et al. | |
| 5,399,125 A | 3/1995 | Dozier | |
| 5,443,415 A | 8/1995 | Shebanow et al. | |

(Continued)

FOREIGN PATENT DOCUMENTS

EP 0 756 917 A1 5/1997

(Continued)

*Primary Examiner*—Dung Van Nguyen
(74) *Attorney, Agent, or Firm*—Fish & Richardson

(57) ABSTRACT

A chemical mechanical polishing apparatus has a rotatable platen, a polishing sheet that is wider than the substrate extending between two reels, a drive mechanism to advance the polishing sheet, and a chucking mechanism to intermittently secure the polishing sheet to the platen. The platen can have a platen base that is adaptable to receive either a circular platen top or a rectangular platen top.

8 Claims, 13 Drawing Sheets

U.S. PATENT DOCUMENTS

| | | |
|---|---|---|
| 5,476,413 A | 12/1995 | Hasegawa et al. |
| 5,487,697 A | 1/1996 | Jensen |
| 5,490,808 A | 2/1996 | Jantschek et al. |
| 5,558,568 A | 9/1996 | Talieh et al. |
| 5,593,344 A | 1/1997 | Weldon et al. |
| 5,660,581 A | 8/1997 | Shin et al. |
| 5,676,590 A | 10/1997 | Hiraoka |
| 5,692,947 A | 12/1997 | Talieh et al. |
| 5,704,827 A | 1/1998 | Nishi et al. |
| 5,722,877 A | 3/1998 | Meyer et al. |
| 5,738,574 A * | 4/1998 | Tolles et al. ................ 451/288 |
| 5,762,536 A | 6/1998 | Pant et al. |
| 5,800,248 A | 9/1998 | Pant et al. |
| 5,871,390 A | 2/1999 | Pant et al. |
| 5,897,426 A | 4/1999 | Somekh |
| 5,899,801 A | 5/1999 | Tolles et al. |
| 5,913,716 A | 6/1999 | Mucci et al. |
| 5,997,384 A | 12/1999 | Blalock |
| 6,059,643 A | 5/2000 | Hu et al. |
| 6,068,542 A | 5/2000 | Hosokai |
| 6,089,962 A | 7/2000 | Spinasse |
| 6,103,628 A | 8/2000 | Talich |
| 6,241,585 B1 * | 6/2001 | White ......................... 451/41 |
| 6,244,935 B1 | 6/2001 | Birang et al. |
| 6,276,996 B1 | 8/2001 | Chopra |
| 6,312,319 B1 | 11/2001 | Donohue et al. |
| 6,379,231 B1 | 4/2002 | Birang et al. |
| 6,520,841 B1 * | 2/2003 | Birang et al. ................. 451/41 |
| 6,729,944 B1 * | 5/2004 | Birang et al. ............... 451/296 |

FOREIGN PATENT DOCUMENTS

| | | |
|---|---|---|
| EP | 0 818 272 A1 | 1/1998 |
| JP | 62-162 466 | 7/1987 |
| JP | 2 269 553 | 11/1990 |
| JP | 4 250 967 | 9/1992 |
| JP | 7-111 256 | 4/1996 |
| JP | 10 034 514 | 2/1998 |

* cited by examiner

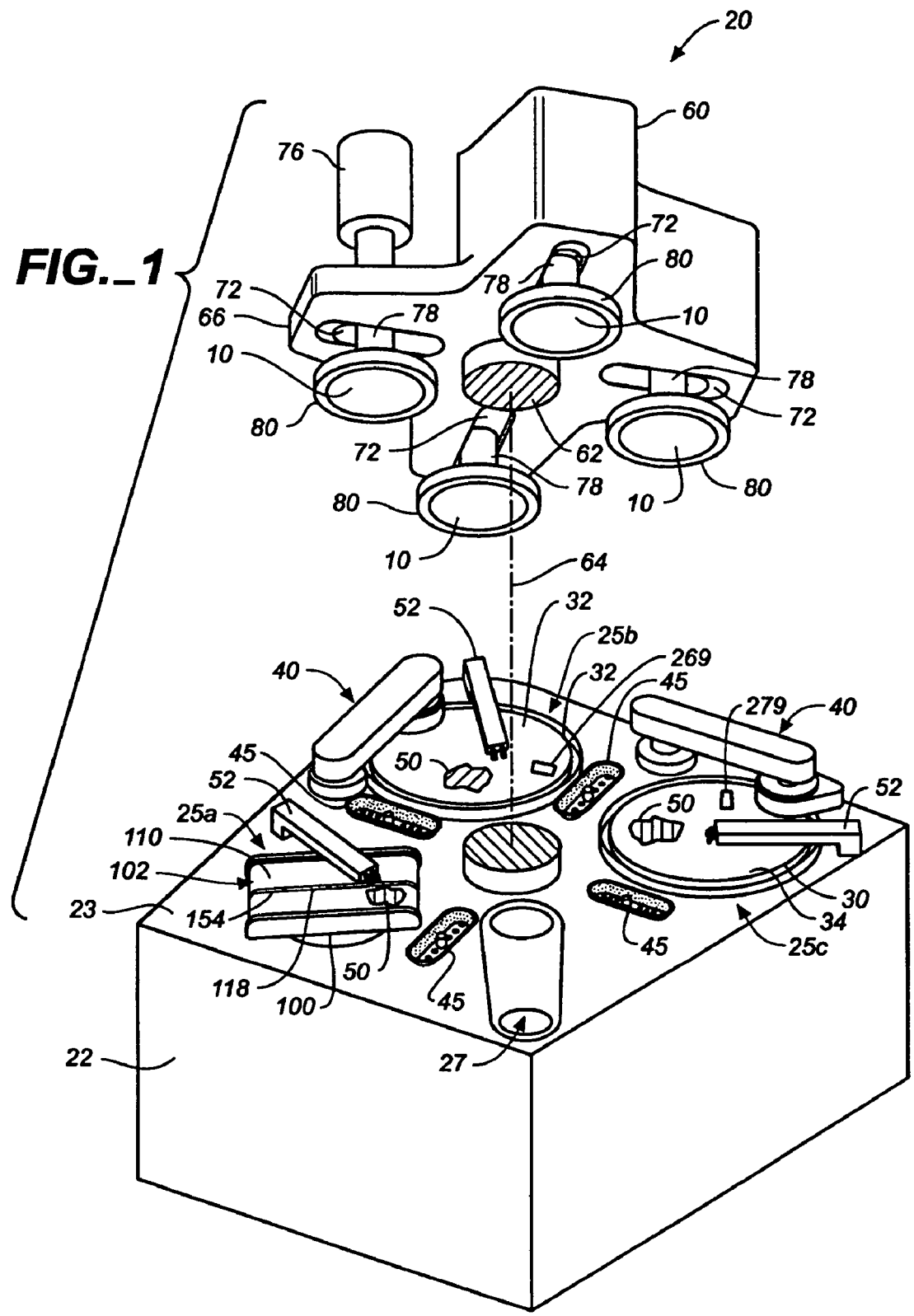
FIG._1

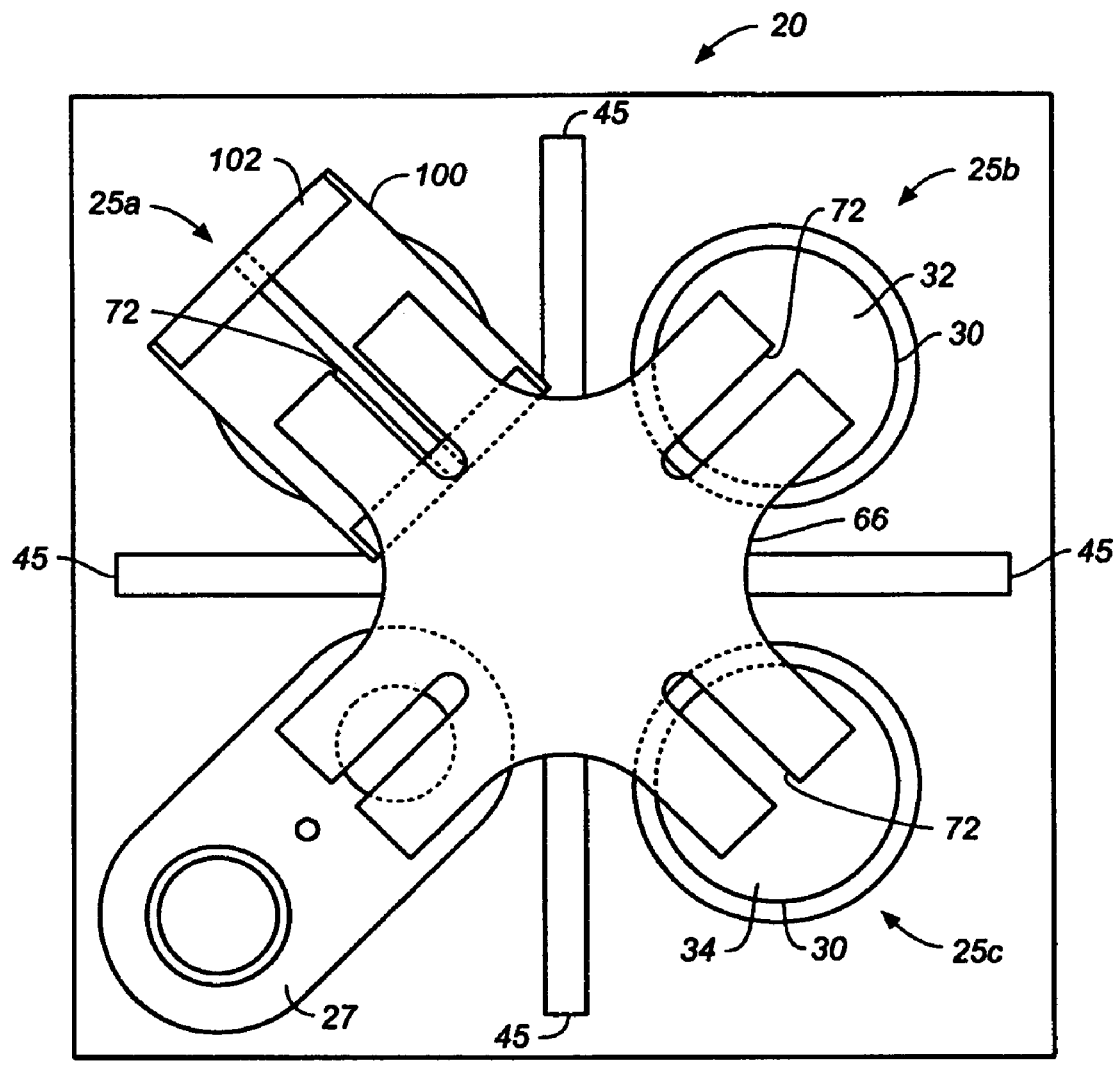
FIG._2

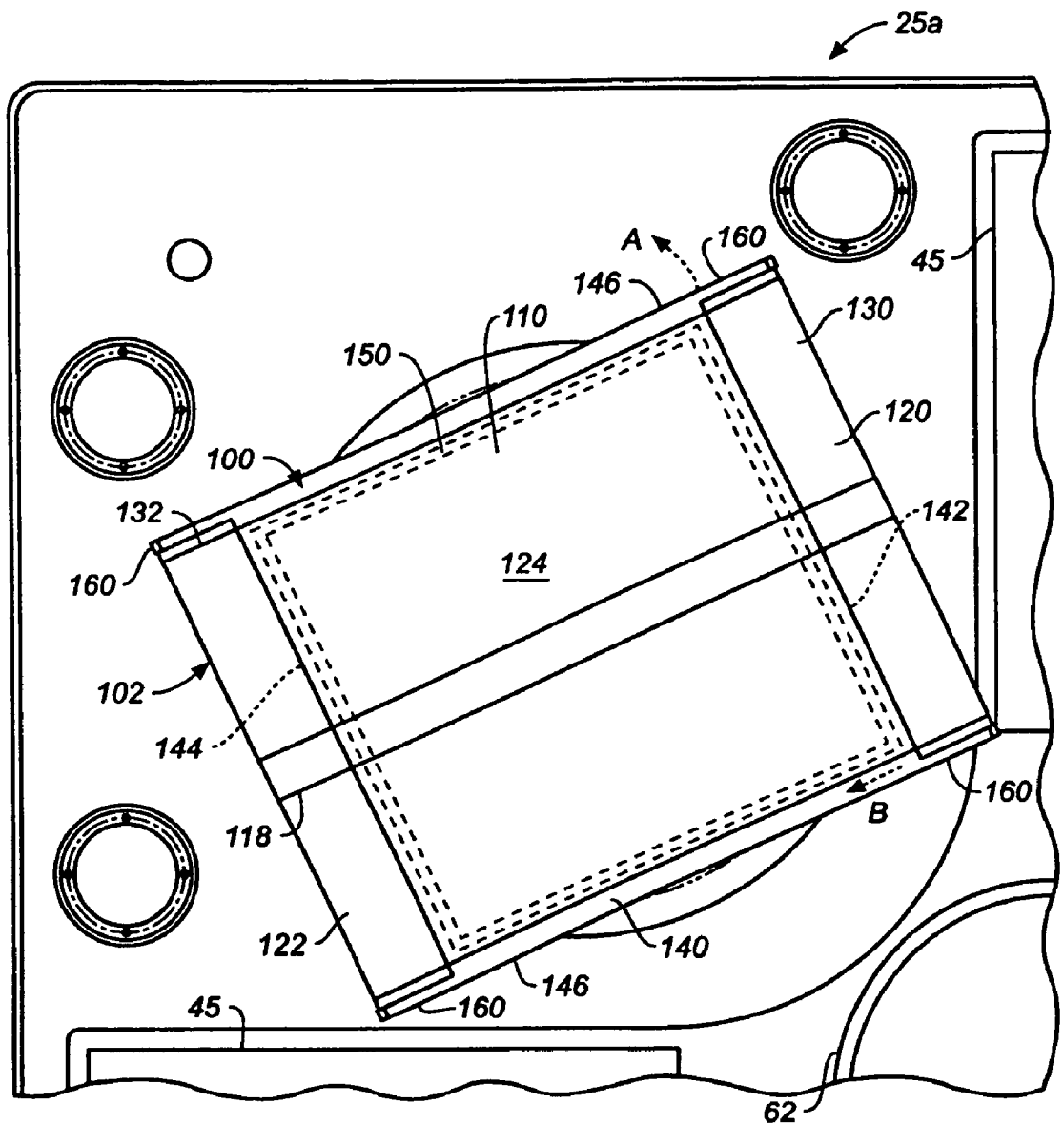
FIG._3A

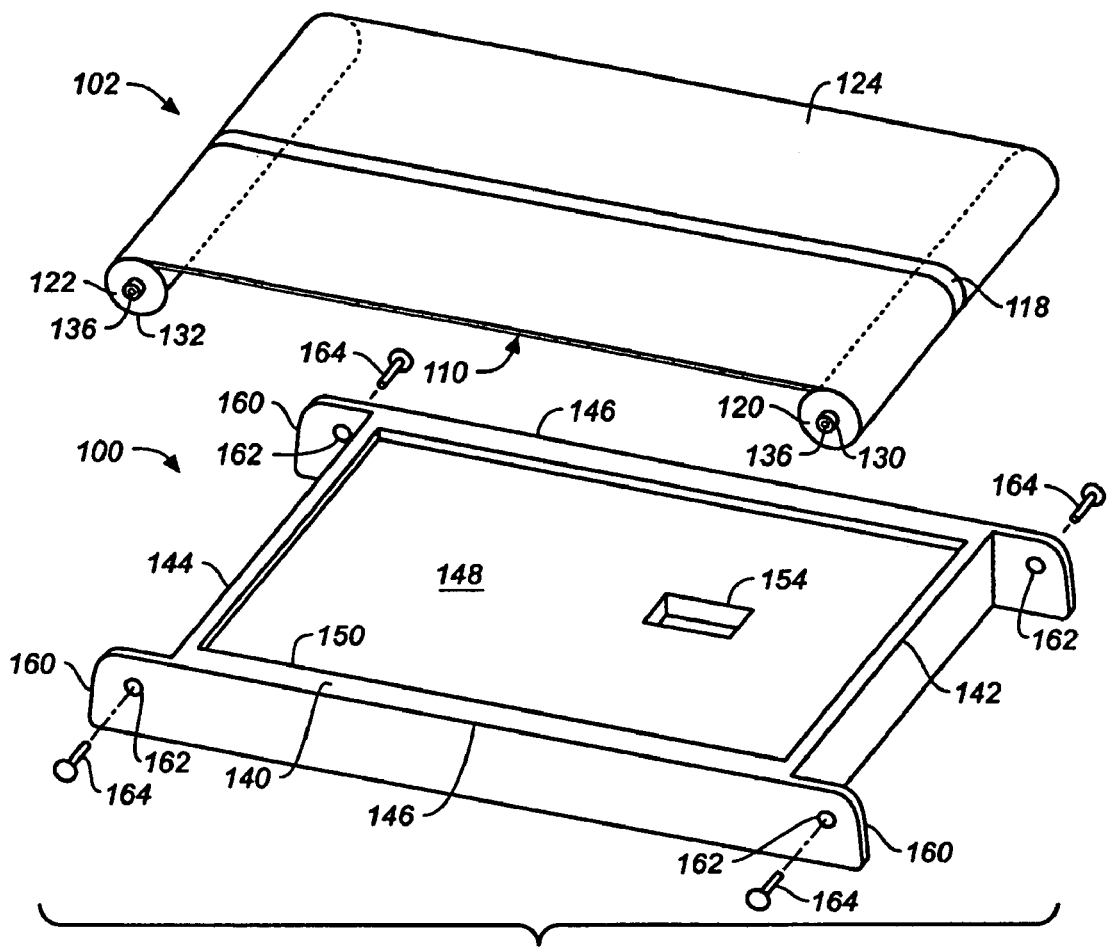
FIG._3B
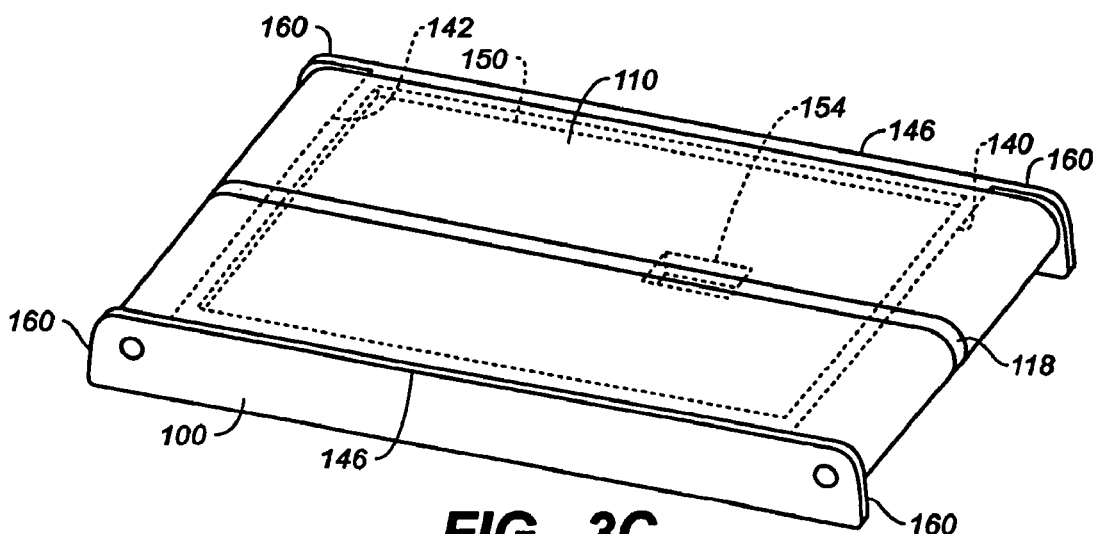
FIG._3C

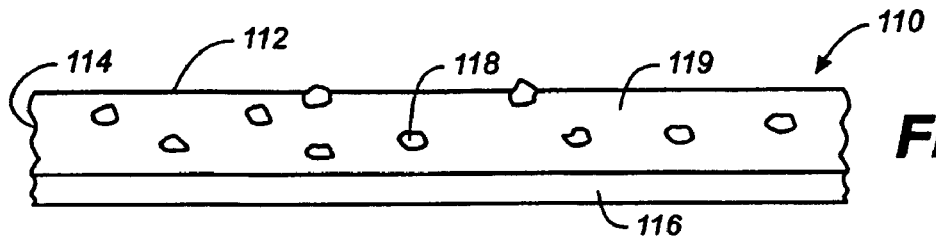
*FIG._4*
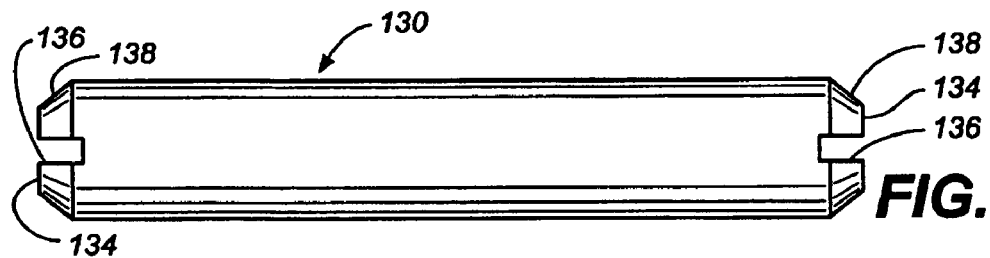
*FIG._5A*
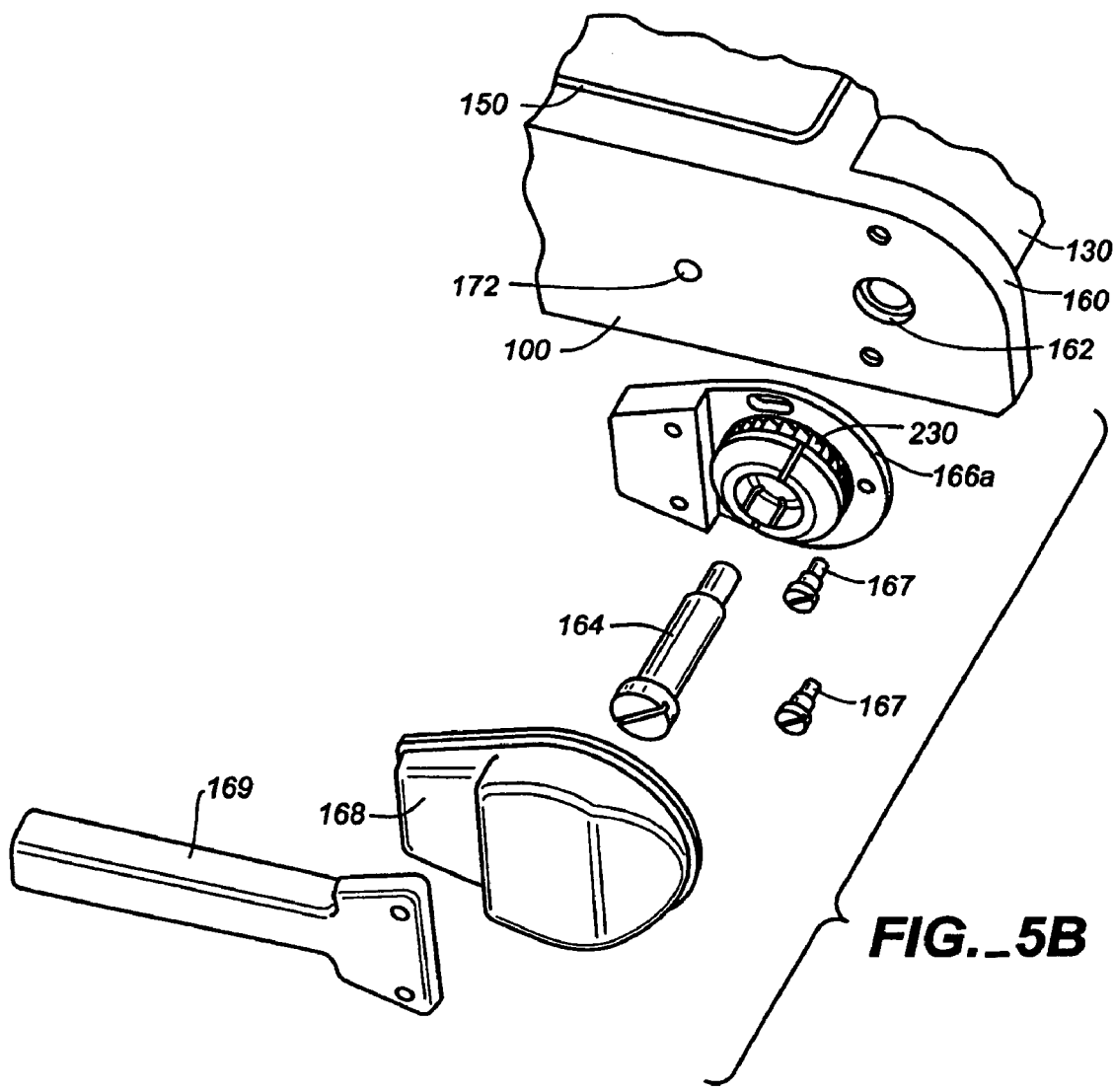
*FIG._5B*

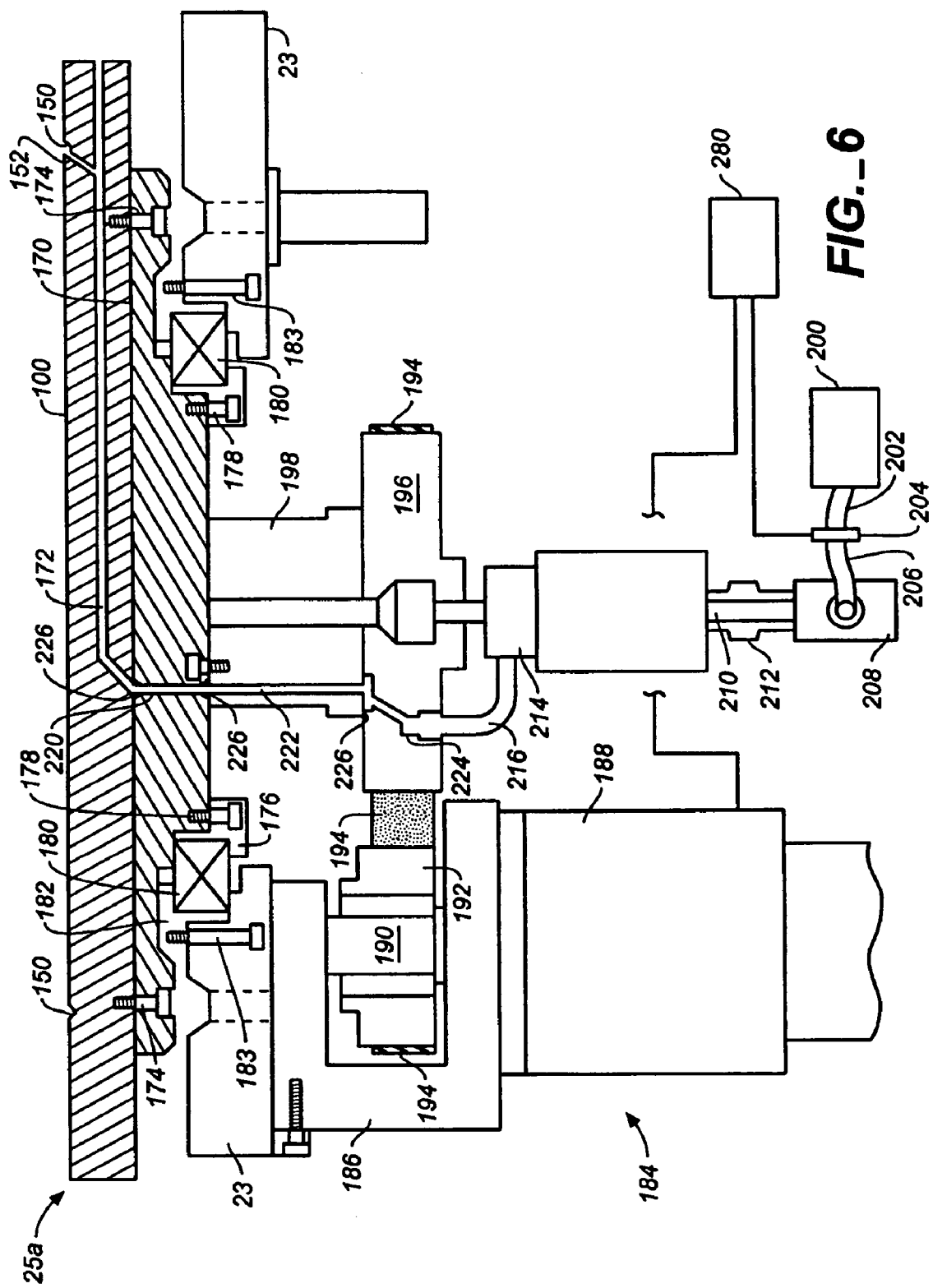
FIG._6

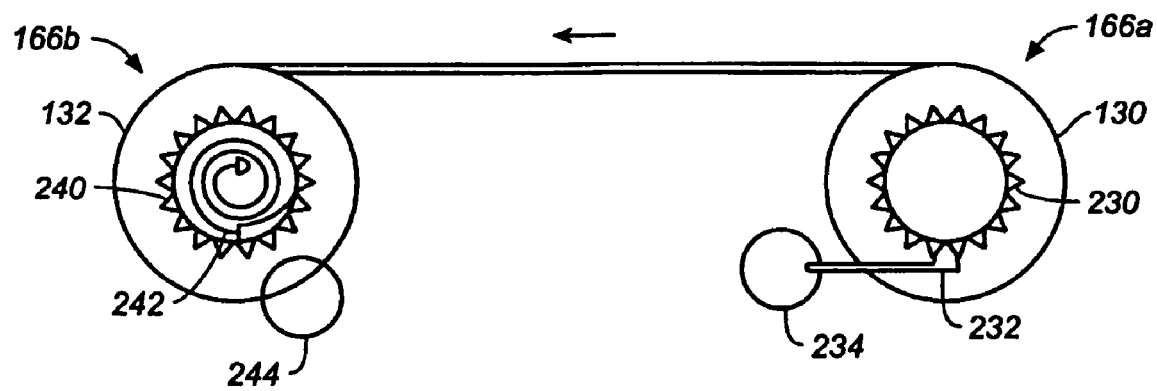
FIG._7
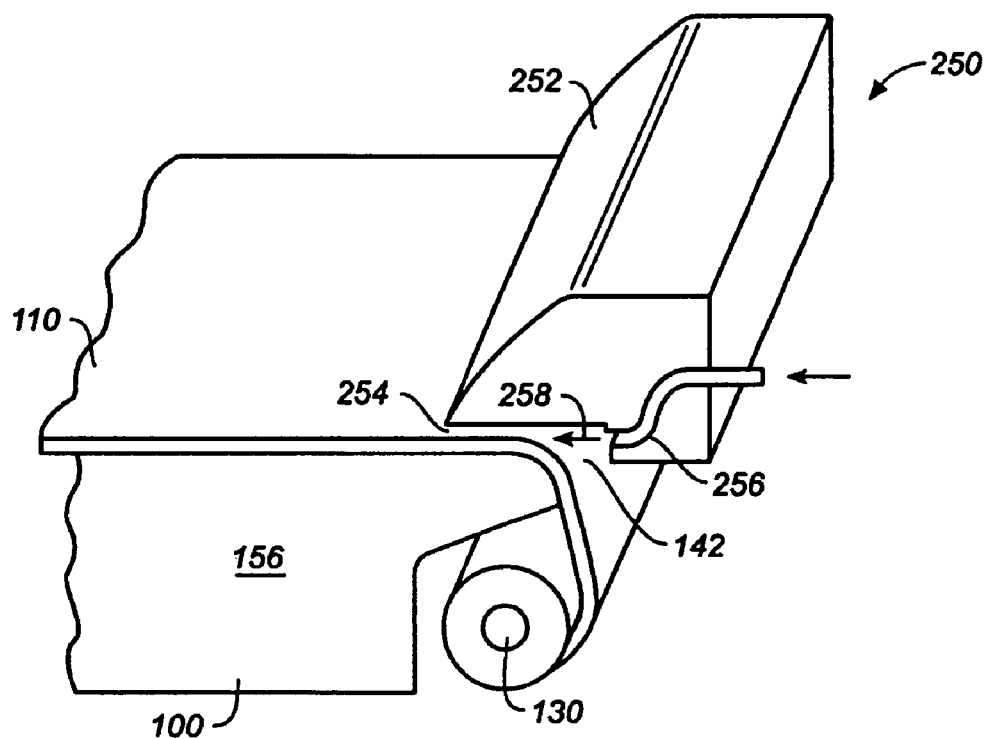
FIG._8

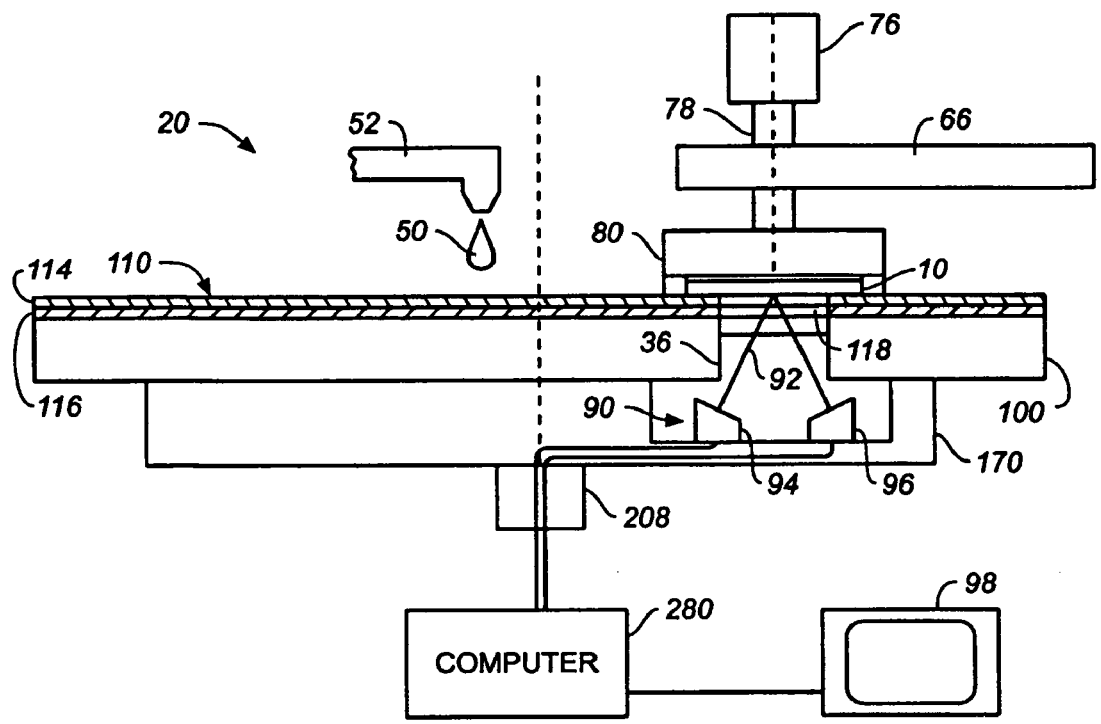
FIG._9
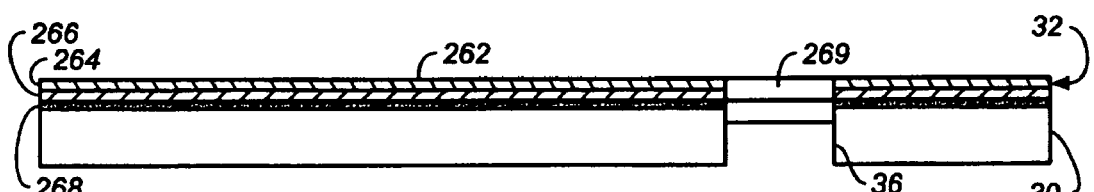
FIG._10
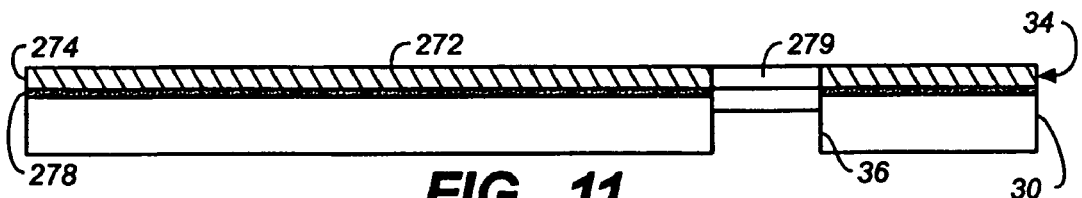
FIG._11

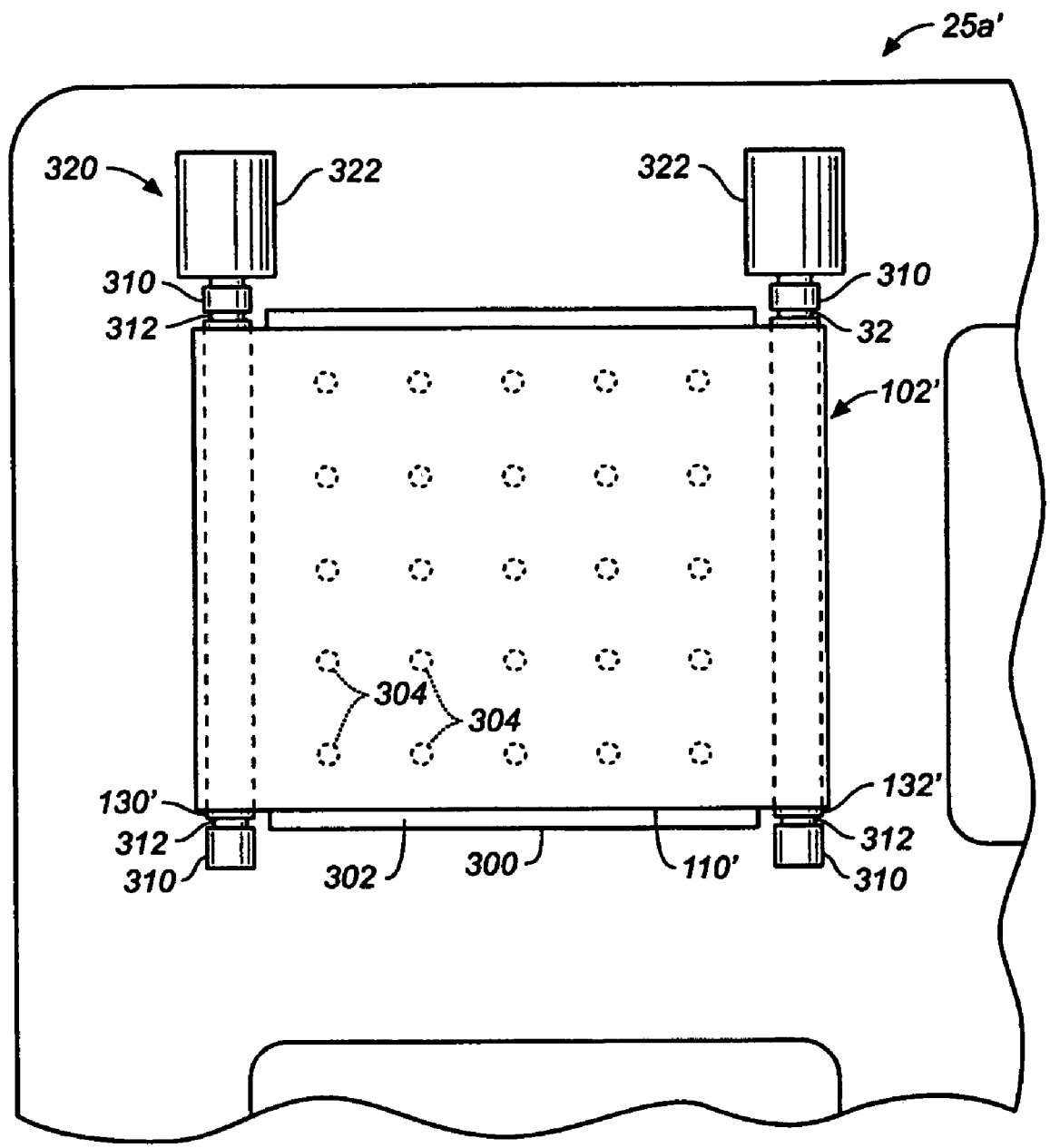
FIG._12

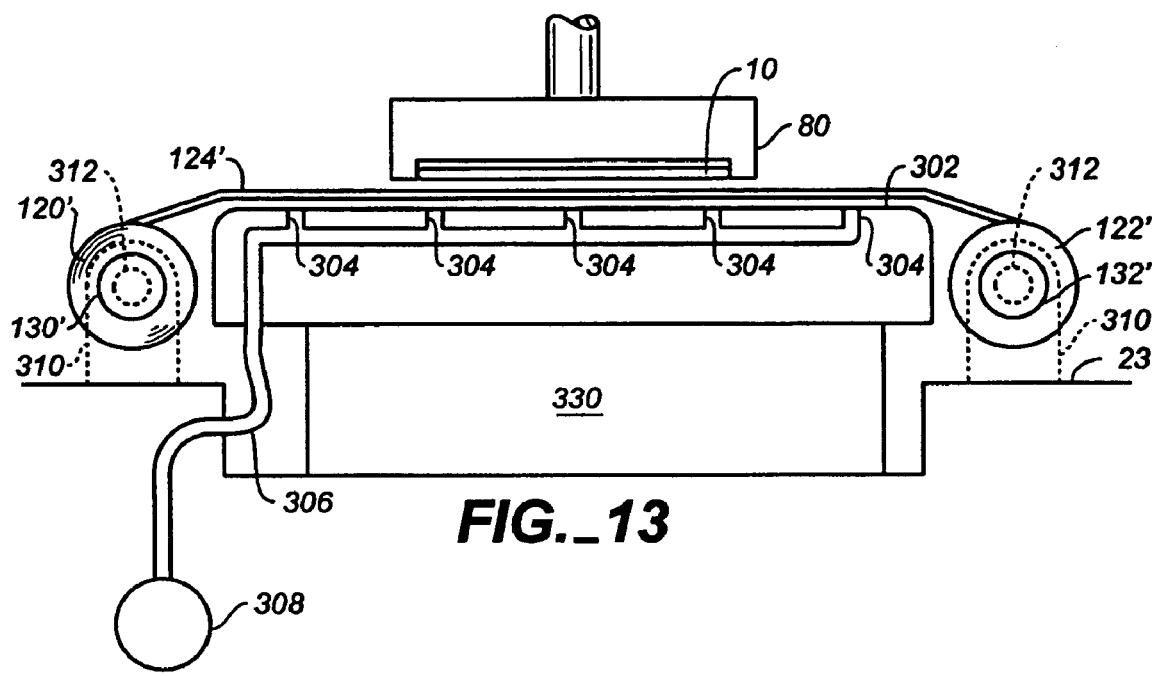
FIG._13
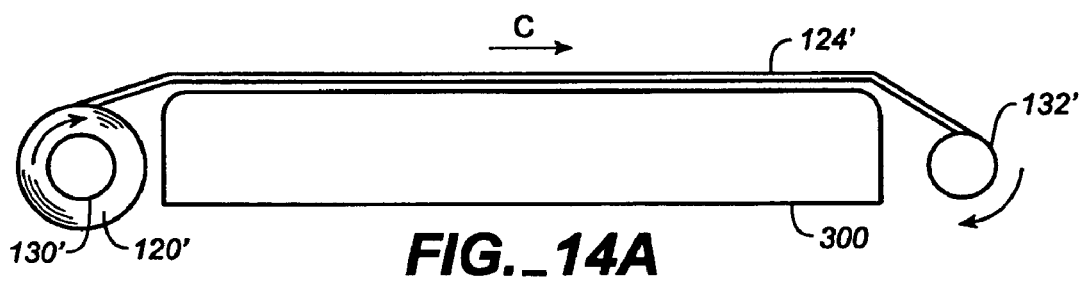
FIG._14A
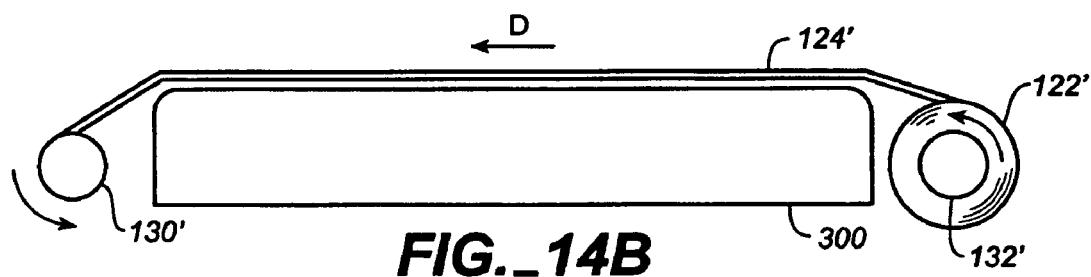
FIG._14B

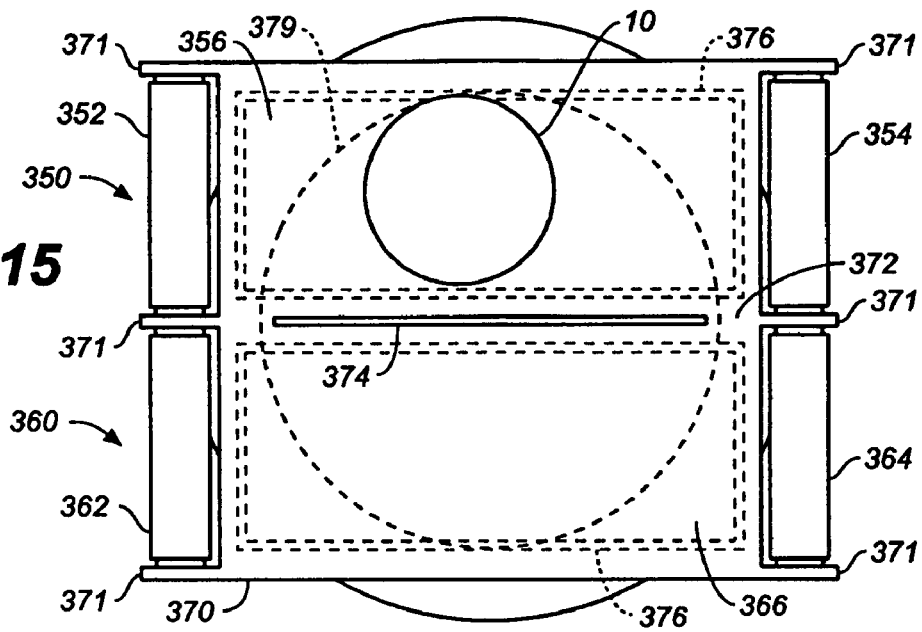
FIG._15
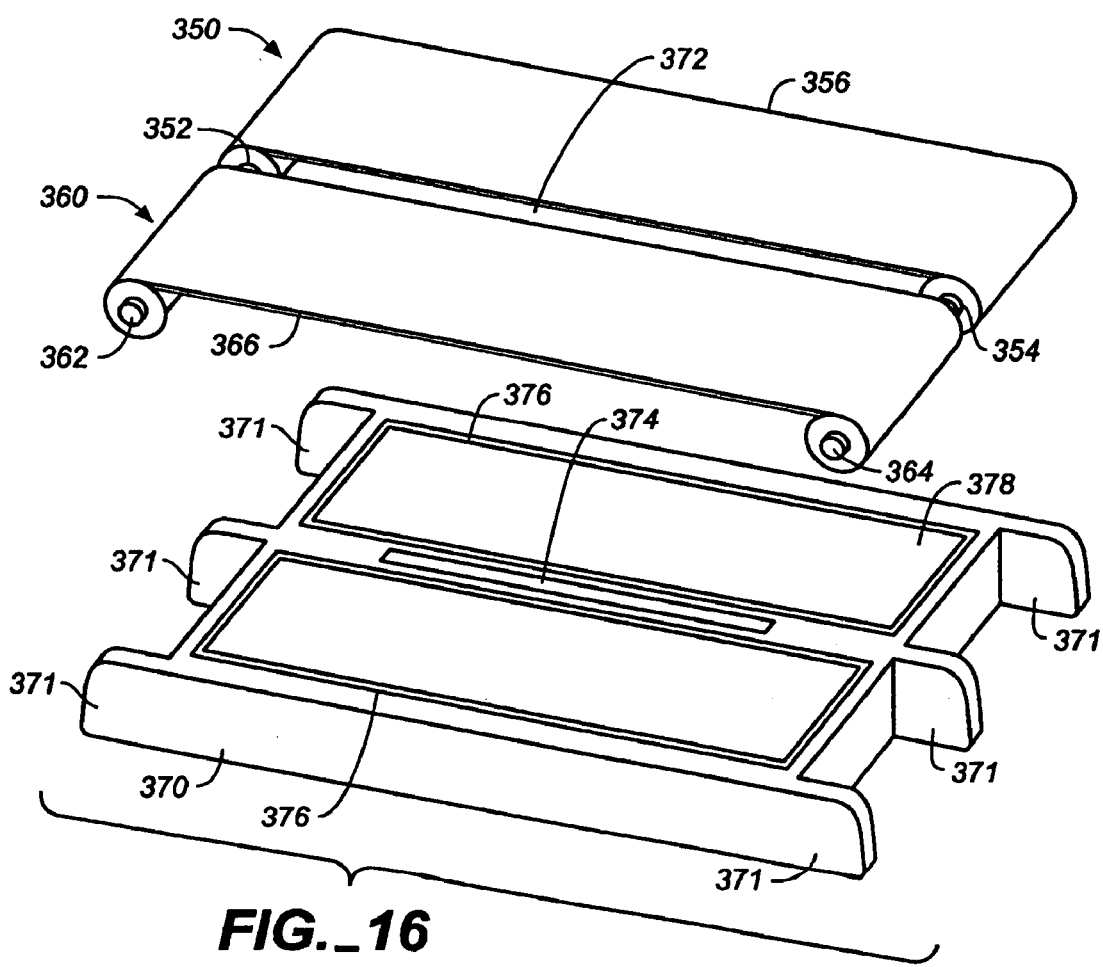
FIG._16

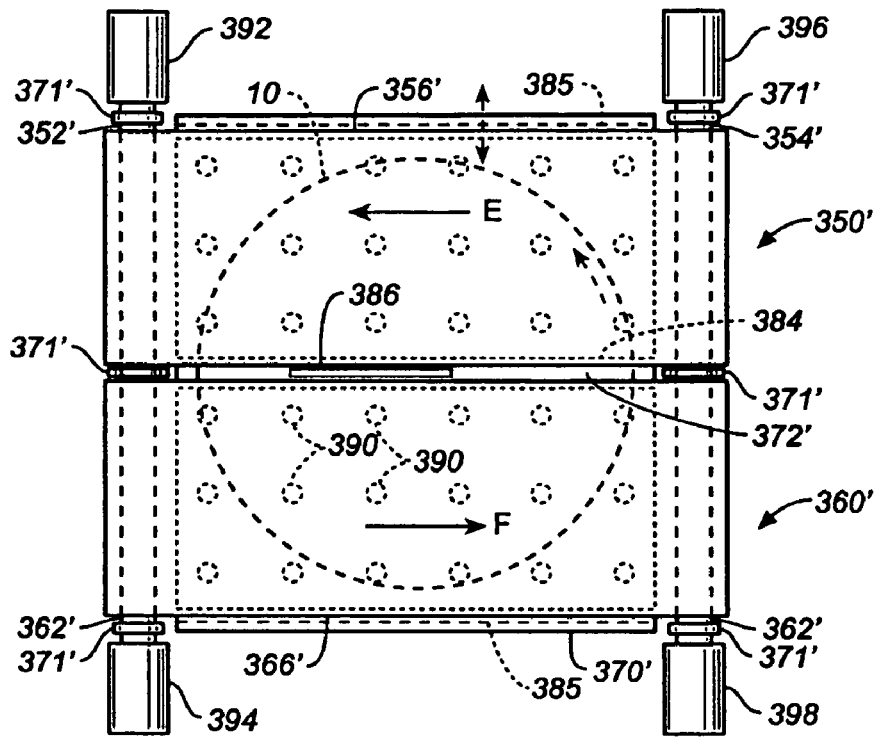
FIG._17A
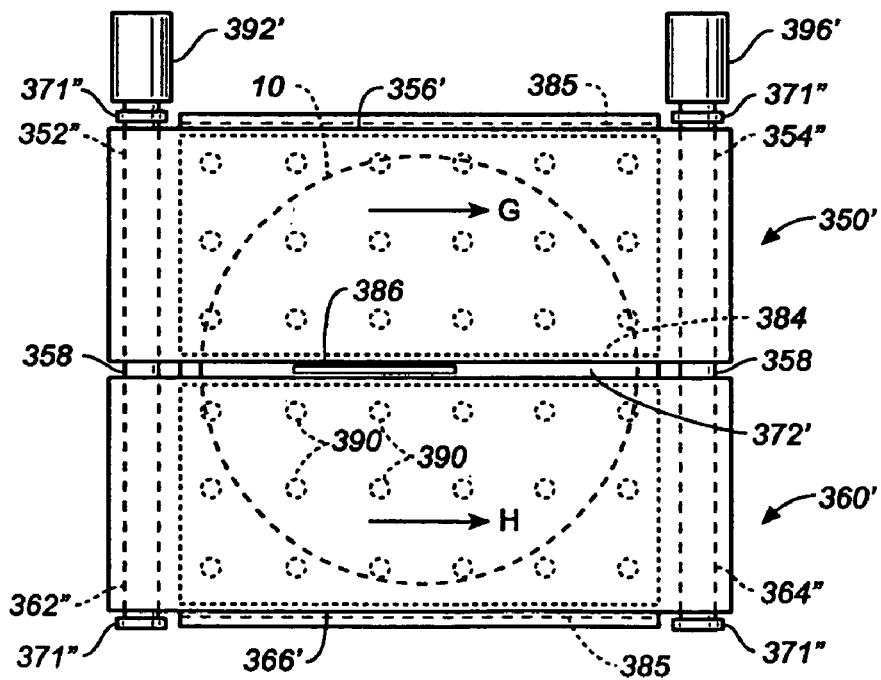
FIG._17B

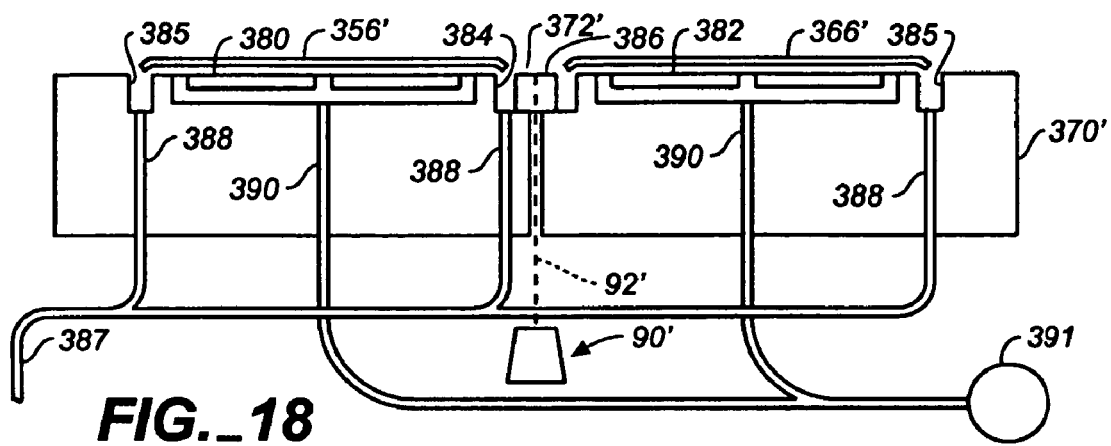
FIG._18
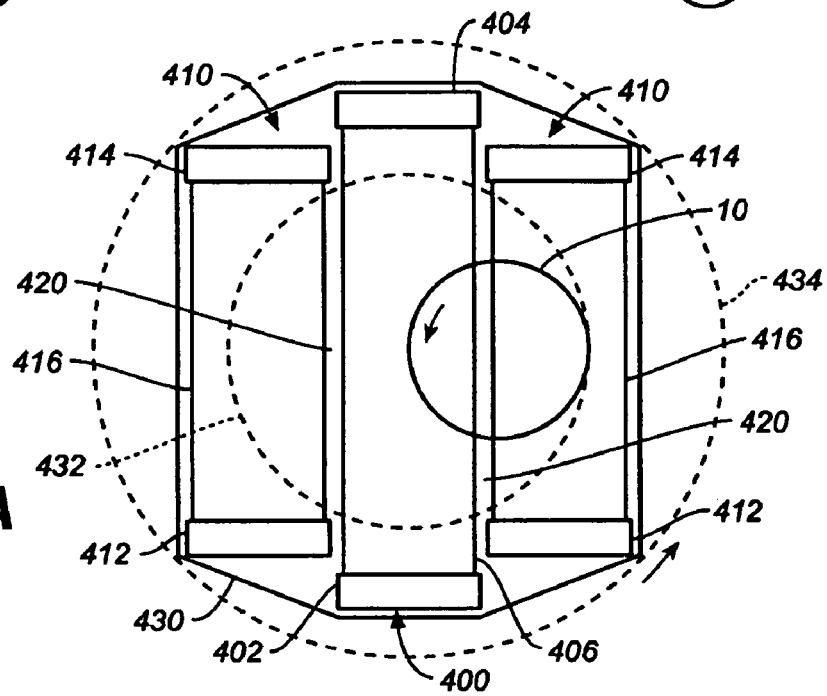
FIG._19A
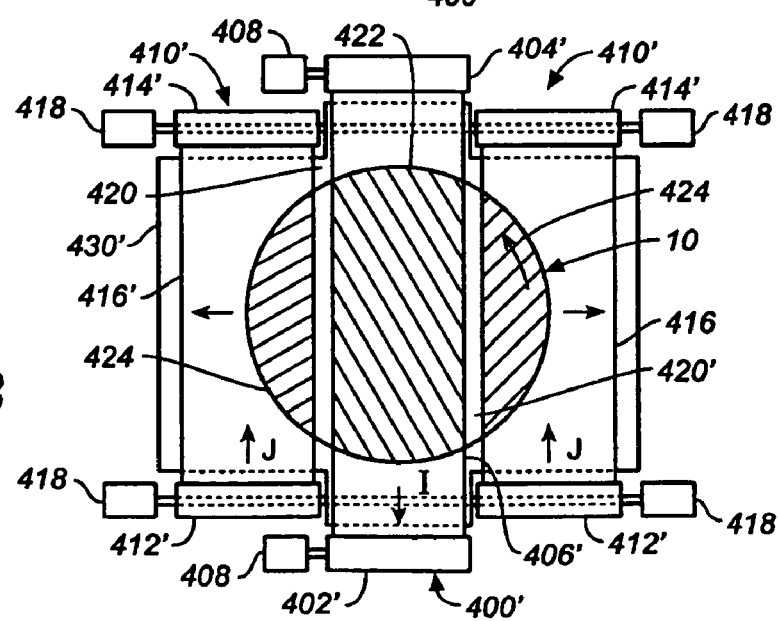
FIG._19B

CHEMICAL MECHANICAL POLISHING APPARATUS WITH ROTATING BELT

CROSS-REFERENCE TO RELATED APPLICATIONS

The present application is a continuation of U.S. patent application Ser. No. 10/174,476, filed Jun. 17, 2002 now U.S. Pat. No. 6,729,944, which is a continuation of U.S. application Ser. No. 09/302,570, filed Apr. 30, 1999, now U.S. Pat. No. 6,475,070, which is a continuation-in-part of U.S. patent application Ser. No. 09/244,456, filed Feb. 4, 1999, now U.S. Pat. No. 6,244,935. The present application claims priority to each of the above referenced patent applications, the entire contents of which patent applications are hereby incorporated by reference in their entirety.

BACKGROUND

The present invention relates to apparatus and methods for chemical mechanical polishing a substrate, and more particularly to such apparatus and methods using a moving polishing sheet.

An integrated circuit is typically formed on a substrate by the sequential deposition of conductive, semiconductive or insulative layers on a silicon wafer. One fabrication step involves depositing a filler layer over a patterned stop layer, and planarizing the filler layer until the stop layer is exposed. For example, trenches or holes in an insulative layer may be filled with a conductive layer. After planarization, the portions of the conductive layer remaining between the raised pattern of the insulative layer form vias, plugs and lines that provide conductive paths between thin film circuits on the substrate.

Chemical mechanical polishing (CMP) is one accepted method of planarization. This planarization method typically requires that the substrate be mounted on a carrier or polishing head. The exposed surface of the substrate is placed against a rotating polishing pad. The polishing pad may be either a "standard" pad or a fixed-abrasive pad. A standard pad has a durable roughened surface, whereas a fixed-abrasive pad has abrasive particles held in a containment media. The carrier head provides a controllable load, i.e., pressure, on the substrate to push it against the polishing pad. A polishing slurry, including at least one chemically-reactive agent, and abrasive particles if a standard pad is used, is supplied to the surface of the polishing pad.

An effective CMP process not only provides a high polishing rate, but also provides a substrate surface which is finished (lacks small-scale roughness) and flat (lacks large-scale topography). The polishing rate, finish and flatness are determined by the pad and slurry combination, the relative speed between the substrate and pad, and the force pressing the substrate against the pad. The polishing rate sets the time needed to polish a layer, which in turn sets the maximum throughput of the CMP apparatus.

During CMP operations, the polishing pad needs to be replaced periodically. For a fixed-abrasive pad, the substrate wears away the containment media to expose the embedded abrasive particles. Thus, the fixed-abrasive pad is gradually consumed by the polishing process. After a sufficient number of polishing runs the fixed-abrasive pad needs to be replaced. For a standard pad, the substrate thermally and mechanically damages the polishing pad and causes the pad=s surface to become smoother and less abrasive. Therefore, standard pads must be periodically "conditioned" to restore a roughened texture to their surface. After a sufficient number of conditioning operations (e.g., three hundred to four hundred), the conditioning process consumes the pad or the pad is unable to be properly conditioned. The pad must then be replaced.

One problem encountered in the CMP process is difficulty in replacing the polishing pad. The polishing pad may be attached to the platen surface with an adhesive. Significant physical effort is often required to peel the polishing pad away from the platen surface. The adhesive then must be removed from the platen surface by scraping and washing with a solvent. A new polishing pad can then be adhesively attached to the clean surface of the platen. While this is happening, the platen is not available for the polishing of substrates, resulting in a decrease in polishing throughput.

SUMMARY

In one aspect, the invention is directed to a chemical mechanical polishing apparatus that has a platen, a polishing sheet extending between the a first reel and a second reel, and a motor to drive at least one of the first and second reels to move the polishing sheet in a linear direction across the top surface of the platen during polishing. The polishing sheet has a width greater than a diameter of a substrate to be polished and has a portion extending over a top surface of the platen for polishing the substrate.

Implementations of the invention may include the following. The motor may drive the first and second reels in a first direction to transfer the polishing sheet from the first reel to the second reel, and in a second direction to transfer the polishing sheet from the second reel to the first reel. A controller may cause the motor to alternate between driving the first and second reels in the first and second directions. The controller may be configured to cause the motor to decelerate when one of the first and second reels is nearly empty. Also, the controller may be configured to cause the motor to accelerate until the polishing sheet is moving at a desired speed, e.g., about one meter per second. The platen may include a plurality of passages to provide fluid to a top surface of the platen and create a fluid bearing between the polishing sheet and the platen. A fluid source may be fluidly coupled to the plurality of passages. An actuator may move the platen, which may be generally rectangular in shape, toward and away from the polishing sheet. A rotatable carrier head may hold the substrate. A frame and a plurality of retainers may secure the first and second reels to the frame. The polishing sheet may be a generally linear strip of a fixed abrasive polishing material.

In another aspect, the invention is directed to a chemical mechanical polishing apparatus that has a platen, a first roller, a second roller, a generally linear polishing sheet extending between the first and second rollers, and a motor to drive at least one of the first and second rollers to transfer the polishing sheet between the first and second rollers and move the polishing sheet in a linear direction across the top surface of the platen. The polishing sheet has a width greater than a diameter of a substrate to be polished. The polishing sheet has a first portion wound around the first roller, a second portion wound around the second roller, and a third portion extending over a top surface of the platen to polish the substrate.

In another aspect, the invention is directed to a chemical mechanical polishing apparatus that has a platen, a first roller, a second roller, a polishing sheet extending between the first and second rollers, a motor to drive the first and second rollers to move the polishing sheet across the top surface of the platen, and a controller to cause the motor to alternately drive the polishing sheet in a first direction and a second, opposing direction during polishing of the substrate. The polishing sheet has a width greater than a diameter of a substrate to be polished and has a portion extending over a top surface of the platen for polishing the substrate.

In another aspect, the invention is directed to a method of chemical mechanical polishing in which a substrate is brought into contact with a polishing sheet that extends between a first reel and a second reel, and the first and second reels are driven to move the polishing sheet in a linear direction across a top surface of a platen during polishing. The polishing sheet has a width greater than a diameter of a substrate to be polished.

Implementations of the invention may include the following. The first and second reels may alternate between being driven in a first direction to transfer the polishing sheet from the first reel to the second reel, and in a second direction to transfer the polishing sheet from the second reel to the first reel. The first and second reels may decelerate when one of the first and second reels is nearly empty. The first and second reels may accelerate until the polishing sheet is moving at a desired speed, e.g., about one meter per second. A fluid may be injected between a top surface of the platen and the polishing sheet to create a fluid bearing therebetween. The platen may be moved vertically to adjust a pressure of the polishing sheet on the substrate. The substrate may be rotated. The polishing sheet may be a fixed abrasive polishing material. A fluid may be injected between a surface of the substrate and the polishing sheet through holes in the polishing sheet.

Advantages of the invention may include the following. More substrates can be polished without replacing the polishing pad, thereby reducing downtime of the CMP apparatus and increasing throughput. A sheet of fixed-abrasive polishing material can be provided in a polishing cartridge. It is easy to remove and replace the polishing cartridge from a platen. The polishing apparatus gains the advantages associated with fixed-abrasive polishing materials. A rotating carrier head can be used to press the substrate against the polishing sheet. Lateral frictional forces on the substrate can be reduced, thereby decreasing the load of the substrate against the retaining ring and improving polishing uniformity. The rigidity of the polishing sheet against the substrate can be adjusted independent of the polishing sheet material.

Other features and advantages will be apparent from the following description, including the drawings and claims.

BRIEF DESCRIPTION OF THE DRAWINGS

FIG. 1 is a schematic exploded perspective view of a chemical mechanical polishing apparatus.

FIG. 2 is a top view of the CMP apparatus of FIG. 1.

FIG. 3A is a top view of the first polishing station of the CMP apparatus of FIG. 1.

FIG. 3B is a schematic exploded perspective view of a rectangular platen and a polishing cartridge.

FIG. 3C is a schematic perspective view of a polishing cartridge attached to a rectangular platen.

FIG. 4 is a schematic cross-sectional view of a fixed abrasive polishing sheet.

FIG. 5A is a schematic cross-sectional view of a feed roller of the polishing cartridge of FIG. 3B.

FIG. 5B is a schematic exploded perspective view of the connection of the feed roller to the rectangular platen.

FIG. 6 is a schematic cross-sectional view of the polishing station of FIG. 3A.

FIG. 7 is a schematic diagrammatic view of a polishing sheet advancing system.

FIG. 8 is a schematic partially cross-sectional and partially perspective view of a contamination guard system for a platen with an advanceable polishing sheet.

FIG. 9 is a schematic cross-sectional view of a polishing station having an optical endpoint detection system.

FIG. 10 is a schematic cross-sectional view of a platen and polishing pad of a second polishing station.

FIG. 11 is a schematic cross-sectional view of a platen and polishing pad of a final polishing station.

FIG. 12 is a schematic top view of a polishing station including a polishing sheet that moves in a linear direction across the substrate during polishing.

FIG. 13 is a schematic cross-sectional side view of the polishing station of FIG. 12.

FIGS. 14A and 14B are schematic cross-sectional views illustrating the motion of the polishing sheet during polishing.

FIG. 15 is a schematic top view of a polishing station that includes two polishing cartridges and a rotatable platen.

FIG. 16 is a schematic exploded perspective view of the platen and polishing cartridges of the polishing station of FIG. 15.

FIG. 17A is a schematic top view of a polishing station that includes two polishing cartridges and a non-rotating platen, in which the polishing sheets are driven in opposite directions.

FIG. 17B is a schematic top view of a polishing station that includes two polishing cartridges and a non-rotating platen, in which the polishing sheets are driven in the same direction.

FIG. 18 is a schematic cross-sectional view of the polishing station of FIG. 17A.

FIG. 19A is a schematic top view of a polishing station that includes three polishing cartridges and a rotating platen.

FIG. 19B is a schematic top view of a polishing station that includes three polishing cartridges and a non-rotating platen.

Like reference numbers are used in the various drawings to indicate like elements. A primed reference number indicates an element that has a modified function, operation or structure.

DETAILED DESCRIPTION

Referring to FIGS. 1 and 2, one or more substrates 10 will be polished by a chemical mechanical polishing apparatus 20. A description of a similar polishing apparatus may be found in U.S. Pat. No. 5,738,574, the entire disclosure of which is incorporated herein by reference. Polishing apparatus 20 includes a machine base 22 with a table top 23 that supports a series of polishing stations, including a first polishing station 25a, a second polishing station 25b, and a final polishing station 25c, and a transfer station 27. Transfer station 27 serves multiple functions, including receiving individual substrates 10 from a loading apparatus (not shown), washing the substrates, loading the substrates into carrier heads, receiving the substrates from the carrier heads, washing the substrates again, and finally, transferring the substrates back to the loading apparatus.

Each polishing station includes a rotatable platen. At least one of the polishing stations, such as first station 25a, includes a polishing cartridge 102 mounted to a rotatable, rectangular platen 100. The polishing cartridge 102 includes a linearly advanceable sheet or belt of fixed-abrasive polishing material. The remaining polishing stations, e.g., second polishing station 25b and final polishing station 25c, may include "standard" polishing pads 32 and 34, respectively, each adhesively attached to a circular platen 30. Each platen may be connected to a platen drive motor (not shown) that rotates the platen at thirty to two hundred revolutions per minute, although lower or higher rotational speeds may be used. Assuming that substrate 10 is an "eight-inch" (200 mm) diameter disk, then rectangular platen 100 may be about twenty inches on a side, and circular platen 30 and polishing pads 32 and 34 may be about thirty inches in diameter.

Each polishing station 25a, 25b and 25c also includes a combined slurry/rinse arm 52 that projects over the associated polishing surface. Each slurry/rinse arm 52 may include two or more slurry supply tubes to provide a polishing liquid, slurry, or cleaning liquid to the surface of the polishing pad. For example, the polishing liquid dispensed onto the fixed-abrasive polishing sheet at first polishing station 25a will not include abrasive particles, whereas the slurry dispensed onto the standard polishing pad at second polishing station 25b will include abrasive particles. If final polishing station 25a is used for buffing, the polishing liquid dispensed onto the polishing pad at that station would not include abrasive particles. Typically, sufficient liquid is provided to cover and wet the entire polishing pad. Each slurry/rinse arm also includes several spray nozzles (not shown) which provide a high-pressure rinse at the end of each polishing and conditioning cycle.

The polishing stations that include a standard polishing pad, i.e., polishing station 25b and 25c, may include an optional associated pad conditioner apparatus 40. The polishing stations that include a fixed-abrasive polishing pad, i.e., polishing station 25a, may include an optional unillustrated cleaning apparatus to remove grit or polishing debris from the surface of the polishing sheet. The cleaning apparatus may include a rotatable brush to sweep the surface of the polishing sheet and/or a nozzle to spray a pressurized cleaning liquid, e.g., deionized water, onto the surface of the polishing sheet. The cleaning apparatus can be operated continuously, or between polishing operations. In addition, the cleaning apparatus could be stationary, or it could sweep across the surface of the polishing sheet.

In addition, optional cleaning stations 45 may be positioned between polishing stations 25a and 25b, between polishing stations 25b and 25c, between polishing station 25c and transfer station 27, and between transfer station 27 and polishing station 25a, to clean the substrate as it moves between the stations.

A rotatable multi-head carousel 60 is supported above the polishing stations by a center post 62 and is rotated about a carousel axis 64 by a carousel motor assembly (not shown). Carousel 60 includes four carrier head systems mounted on a carousel support plate 66 at equal angular intervals about carousel axis 64. Three of the carrier head systems receive and hold substrates, and polish them by pressing them against the polishing sheet of station 25a and the polishing pads of stations 25b and 25c. One of the carrier head systems receives a substrate from and delivers a substrate to transfer station 27.

Each carrier head system includes a carrier or carrier head 80. A carrier drive shaft 78 connects a carrier head rotation motor 76 (shown by the removal of one quarter of the carousel cover) to carrier head 80 so that each carrier head can independently rotate about its own axis. In addition, each carrier head 80 independently laterally oscillates in a radial slot 72 formed in carousel support plate 66.

The carrier head 80 performs several mechanical functions. Generally, the carrier head holds the substrate against the polishing surface, evenly distributes a downward pressure across the back surface of the substrate, transfers torque from the drive shaft to the substrate, and ensures that the substrate does not slip out from beneath the carrier head during polishing operations. A description of a suitable carrier head may be found in U.S. patent application Ser. No. 08/861,260, entitled a CARRIER HEAD WITH a FLEXIBLE MEMBRANE FOR a CHEMICAL MECHANICAL POLISHING SYSTEM, filed May 21, 1997 by Steven M. Zuniga et al., assigned to the assignee of the present invention, the entire disclosure of which is incorporated herein by reference.

Referring to FIGS. 3A, 3B, and 3C, polishing cartridge 102 is detachably secured to rectangular platen 100 at polishing station 25a. Polishing cartridge 102 includes a feed roller 130, a take-up roller 132, and a generally linear sheet or belt 110 of a polishing pad material. An unused or "fresh" portion 120 of the polishing sheet is wrapped around feed roller 130, and a used portion 122 of the polishing sheet is wrapped around take-up roller 132. A rectangular exposed portion 124 of the polishing sheet that is used to polish substrates extends between the used and unused portions 120, 122 over a top surface 140 of rectangular platen 100.

The rectangular platen 100 can be rotated (as shown by phantom arrow "A" in FIG. 3A) to rotate the exposed portion of the polishing sheet and thereby provide relative motion between the substrate and the polishing sheet during polishing. Between polishing operations, the polishing sheet can be advanced (as shown by phantom arrow "B" in FIG. 3A) to expose an unused portion of the polishing sheet. When the polishing material advances, polishing sheet 110 unwraps from feed roller 130, moves across the top surface of the rectangular platen, and is taken up by take-up roller 132.

Referring to FIG. 4, polishing sheet 110 is preferably a fixed-abrasive polishing pad having a polishing surface 112. The fixed-abrasive polishing pad may be about twenty inches wide and about 0.005 inches thick. The fixed-abrasive polishing pad may include an upper layer 114 and a lower layer 116. Upper layer 114 is an abrasive composite layer composed of abrasive grains held or embedded in a binder material. The abrasive grains may have a particle size between about 0.1 and 1500 microns. Examples of such grains include silicon oxide, fused aluminum oxide, ceramic aluminum oxide, green silicon carbide, silicon carbide, chromia, alumina zirconia, diamond, iron oxide, ceria, cubic boron nitride, garnet and combinations thereof. The binder material may be derived from a precursor which includes an organic polymerizable resin which is cured to form the binder material. Examples of such resins include phenolic resins, urea-formaldehyde resins, melamine formaldehyde resins, acrylated urethanes, acrylated epoxies, ethylenically unsaturated compounds, aminoplast derivatives having at least one pendant acrylate group, isocyanurate derivatives having at least one pendant acrylate group, vinyl ethers, epoxy resins, and combinations thereof. Lower layer 116 is a backing layer composed of a material such as a polymeric film, paper, cloth, a metallic film or the like. A fixed-abrasive polishing sheet having a polyester belt that carries silicon oxide abrasive particles is available from 3M Corporation of Minneapolis, Minn.

Referring again to FIGS. 3A, 3B and 3C, a transparent strip 118 is formed along the length of polishing sheet 110.

The transparent strip may be positioned at the center of the sheet, and may be about 0.6 inches wide. Transparent strip 118 may be formed by excluding abrasive particles from this region of the containment media during fabrication of the polishing sheet. The transparent strip will be aligned with an aperture or transparent window 154 in rectangular platen 100 to provide optical monitoring of the substrate surface for end point detection, as discussed in greater detail below.

The feed and take-up rollers 130 and 132 should be slightly longer than the width of polishing sheet 110. The rollers 130, 132 may be plastic or metal cylinders about 20" long and about 2" in diameter. Referring to FIG. 5A, the opposing end faces 134 of feed roller 130 (only the feed roller is shown, but the take-up roller would be constructed similarly) each include a recess 136 which will engage a support pin 164 (see FIGS. 3B and 5B) that will secure the roller to the platen. In addition, both end faces 134 of each roller may be chamfered at edge 138 to prevent polishing sheet 110 from slipping laterally.

Returning to FIGS. 3A, 3B and 3C, rectangular platen 100 includes a generally planar rectangular top surface 140 bounded by a feed edge 142, a take-up edge 144, and two parallel lateral edges 146. A groove 150 (shown in phantom in FIGS. 3A and 3C) is formed in top surface 140. The groove 150 may be a generally-rectangular pattern that extends along edges 142-146 of top surface 140. A passage 152 through platen 100 connects groove 150 to a vacuum source 200 (see FIG. 6). When passage 152 is evacuated, exposed portion 124 of polishing sheet 110 is vacuum-chucked to top surface 140 of platen 100. This vacuum-chucking helps ensure that lateral forces caused by friction between the substrate and the polishing sheet during polishing do not force the polishing sheet off the platen. A central region 148 of top surface 140 is free from grooves to prevent potential deflection of the polishing sheet into the grooves from interfering with the polishing uniformity. As discussed, aperture 154 is formed in top surface 140 of rectangular platen 100. An unillustrated compressible backing pad may be placed on the top surface of the platen to cushion the impact of the substrate against the polishing sheet. In addition, platen 100 may include an unillustrated shim plate. Shim plates of differing thickness may be attached to the platen to adjust the vertical position of the top surface of platen. The compressible backing pad can be attached to the shim plate.

The rectangular platen 100 also includes four retainers 160 that hold feed and take-up rollers 130 and 132 at feed and take-up edges 142 and 144, respectively. Each retainer 160 includes an aperture 162. At each retainer, a pin 164 extends through aperture 162 and into recess 136 (see FIG. 5A) to rotatably connect rollers 130 and 132 to platen 100. To secure polishing cartridge 102 to platen 100, feed roller 130 is slipped into the space between the two retainers along feed edge 142, and two pins 164 are inserted through opposing apertures 162 in retainers 160 to engage the two opposing recesses in the feed roller. Similarly, take-up roller 132 is mounted to platen 100 by slipping it into place between the two retainers along take-up edge 144, and inserting two pins 164 through the opposing apertures 162 to engage the two opposing recesses in the take-up roller.

As shown in FIG. 5B, one pin 164 from each roller 130, 132 may pass through a gear assembly 166a, 166b (see also FIG. 7) that controls the rotation of the pin, and thus the rotation of the roller. Gear assembly 166a may be secured to the side of rectangular platen 100 by screws or bolts 167, and a cover 168 may protect gear assembly 166 from contamination during the polishing process.

The rollers 130 and 132 need to be positioned sufficiently below top surface 140 so that the polishing sheet stays in contact with the feed and take-up edges 142 and 144 of the platen when the entire polishing sheet is wound around either roller. This assists in the creation of a seal between the polishing sheet and the rectangular platen when vacuum is applied to passage 152 to vacuum-chuck the polishing sheet to the platen. Furthermore, feed edge 142 and take-up edge 144 of the platen are rounded to prevent abrasion of the underside of the polishing sheet as it moves across the platen.

As illustrated by FIG. 6, rectangular platen 100 is secured to a rotatable platen base 170. Rectangular platen 100 and platen base 170 may be joined by several peripheral screws 174 counter-sunk into the bottom of platen base 170. A first collar 176 is connected by screws 178 to the bottom of platen base 170 to capture the inner race of an annular bearing 180. A second collar 182, connected to table top 23 by a set of screws 183, captures the outer race of annular bearing 180. Annular bearing 180 supports rectangular platen 100 above table top 23 while permitting the platen to be rotated by the platen drive motor.

A platen motor assembly 184 is bolted to the bottom of table top 23 through a mounting bracket 186. Platen motor assembly 184 includes a motor 188 having an output drive shaft 190. Output shaft 190 is fitted to a solid motor sheath 192. A drive belt 194 winds around motor sheath 192 and a hub sheath 196. Hub sheath 196 is joined to platen base 170 by a platen hub 198. Thus, motor 188 may rotate rectangular platen 100. Platen hub 198 is sealed to lower platen base 170 and to hub sheath 196.

A pneumatic control line 172 extends through rectangular platen 100 to connect passage 152, and thus grooves 150, to a vacuum or pressure source. The pneumatic line 172 may be used both to vacuum-chuck the polishing sheet, and to power or activate a polishing sheet advancement mechanism, described in greater detail below.

The platen vacuum-chucking mechanism and the polishing sheet advancing mechanism may be powered by a stationary pneumatic source 200 such as a pump or a source of pressurized gas. Pneumatic source 200 is connected by a fluid line 202 to a computer controlled valve 204. The computer controlled valve 204 is connected by a second fluid line 206 to a rotary coupling 208. The rotary coupling 208 connects the pneumatic source 200 to an axial passage 210 in a rotating shaft 212, and a coupling 214 connects axial passage 210 to a flexible pneumatic line 216.

Vacuum-chucking passage 152 can be connected to flexible pneumatic line 216 via pneumatic line 172 through rectangular platen 100, a passage 220 in platen base 170, a vertical passage 222 in platen hub 198, and a passageway 224 in hub sheath 196. O-rings 226 may be used to seal each passageway.

A general purpose programmable digital computer 280 is appropriately connected to valve 204, platen drive motor 188, carrier head rotation motor 76, and a carrier head radial drive motor (not shown). Computer 280 can open or close valve 204, rotate platen 100, rotate carrier head 80 and move carrier head along slot 72.

Referring to FIGS. 5B and 7, the polishing cartridge and platen includes a sheet advancing mechanism to incrementally advance polishing sheet 110. Specifically, gear assembly 166a adjacent feed roller 130 includes a feed gear wheel 230 that is rotationally fixed to pin 164. The feed gear wheel 230 engages a ratchet 232 that is held in place by an escapement clutch 234. Ratchet 232 and escapement clutch 234 may be contained in gear assembly 166a, and thus are not shown in FIG. 5B.

The gear assembly 166b (not shown in FIG. 5B) adjacent take-up roller 132 includes a take-up gear wheel 240 that is rotationally fixed to pin 164. The take-up gear wheel 240 engages a slip clutch 244 and a torsion spring 242. The torsion spring 242 applies a constant torque that tends to rotate the take-up roller and advance the polishing sheet. In addition, slip clutch 244 prevents take-up roller 132 from rotating counter to the torque applied by torsion spring 242.

While ratchet 232 engages feed gear wheel 230 on feed roller 130, polishing sheet 110 cannot advance. Thus, torsion spring 242 and slip clutch 244 maintain polishing sheet 110 in a state of tension with the exposed portion of the polishing sheet stretched across the top surface of rectangular platen 100. However, if escapement clutch 234 is activated, ratchet 232 disengages from feed gear wheel 230, and take-up roller 132 can rotate until feed gear wheel 230 reengages ratchet 232, e.g., by one notch. Escapement clutch 234 can be pneumatically controlled by the same pneumatic line 172 that is used to vacuum chuck the polishing sheet 110 to platen 100. An unillustrated tube may connect pneumatic line 172 to gear assembly 166a. If a positive pressure is applied to pneumatic line 172, escapement clutch 234 is activated to move ratchet 232. This permits the feed roller to rotate one notch, with a corresponding advancement of the polishing sheet across the platen. A separate pneumatic line could control escapement clutch 234, although this would require an additional rotary feed-through. Alternately, the linear drive mechanism may include a ratchet 169 (see FIG. 5B) that engages one of the gear assemblies to manually advance the polishing sheet.

A potential problem during polishing is that the unused portion of the polishing sheet may become contaminated by slurry or polishing debris. Referring to FIG. 8, a portion 156 of rectangular platen 100 may project over feed roller 130 so that the feed roller is located beneath the platen top surface and inwardly of the feed edge of the platen. As such, the body of the platen shields the feed roll from contamination. Alternately, an elongated cover with a generally semicircular cross-section can be positioned around each roller. The elongated cover can be secured to the retainers. The polishing sheet would pass through a thin gap between the cover and the platen.

In addition, a contamination guard 250 can be positioned over the feed edge of the rectangular platen. The contamination guard includes a frame 252 that extends along the width of polishing sheet 110 and is suspended above the sheet to form a narrow gap 254. A fluid source (not shown), such as a pump, forces a gas, such as air, through gap 254 via passageway 256 to provide a uniform air flow as shown by arrows 258. The flow of air through gap 254 prevents the polishing liquid or polishing debris from passing beneath contamination guard 250 and contaminating the unused portion of the polishing sheet on feed roller 130.

Referring to FIG. 9, an aperture or hole 154 is formed in platen 100 and is aligned with transparent strip 118 in polishing sheet 110. The aperture 154 and transparent strip 118 are positioned such that they have a "view" of substrate 10 during a portion of the platen's rotation, regardless of the transnational position of the polishing head. An optical monitoring system 90 is located below and secured to platen 100, e.g., between rectangular platen 100 and platen base 170 so that it rotates with the platen. The optical monitoring system includes a light source 94, such as a laser, and a detector 96. The light source generates a light beam 92 which propagates through aperture 154 and transparent strip 118 to impinge upon the exposed surface of substrate 10.

In operation, CMP apparatus 20 uses optical monitoring system 90 to determine the thickness of a layer on the substrate, to determine the amount of material removed from the surface of the substrate, or to determine when the surface has become planarized. The computer 280 may be connected to light source 94 and detector 96. Electrical couplings between the computer and the optical monitoring system may be formed through rotary coupling 208. The computer may be programmed to activate the light source when the substrate overlies the window, to store measurements from the detector, to display the measurements on an output device 98, and to detect the polishing endpoint, as described in U.S. patent application Ser. No. 08/689,930, entitled METHOD OF FORMING A TRANSPARENT WINDOW IN A POLISHING PAD FOR A CHEMICAL MECHANICAL POLISHING APPARATUS, filed Aug. 16, 1996 by Manush Birang et al., assigned to the assignee of the present invention, the entire disclosure of which is incorporated herein by reference.

In operation, exposed portion 124 of polishing sheet 110 is vacuum-chucked to rectangular platen 100 by applying a vacuum to passage 152. A substrate is lowered into contact with polishing sheet 110 by carrier head 80, and both platen 100 and carrier head 80 rotate to polish the exposed surface of the substrate. After polishing, the substrate is lifted off the polishing pad by the carrier head. The vacuum on passage 152 is removed. The polishing sheet is advanced by applying a positive pressure to pneumatic line 172 to trigger the advancement mechanism. This exposes a fresh segment of the polishing sheet. The polishing sheet is then vacuum-chucked to the rectangular platen, and a new substrate is lowered into contact with the polishing sheet. Thus, between each polishing operation, the polishing sheet may be advanced incrementally. If the polishing station includes a cleaning apparatus, the polishing sheet may be washed between each polishing operation., The amount that the sheet may be advanced will depend on the desired polishing uniformity and the properties of the polishing sheet, but should be on the order of 0.05 to 1.0 inches, e.g., 0.4 inch, per polishing operation. Assuming that the exposed portion 124 of polishing sheet is 20 inches long and the polishing sheet advances 0.4 inches after each polishing operation, the entire exposed portion of the polishing sheet will be replaced after about fifty polishing operations.

Referring to FIG. 10, at second polishing station 25b, the circular platen may support a circular polishing pad 32 having a roughed surface 262, an upper layer 264 and a lower layer 266. Lower layer 266 may be attached to platen 30 by a pressure-sensitive adhesive layer 268. Upper layer 264 may be harder than lower layer 266. For example, upper layer 264 may be composed of microporous polyurethane or polyurethane mixed with a filler, whereas lower layer 266 may be composed of compressed felt fibers leached with urethane. A two-layer polishing pad, with the upper layer composed of IC-1000 or IC-1400 and the lower layer composed of SUBA-4, is available from Rodel, Inc. of Newark, Del. (IC-1000, IC-1400 and SUBA-4 are product names of Rodel, Inc.). A transparent window 269 may be formed in polishing pad 32 over an aperture 36 in platen 30.

Referring to FIG. 11, at final polishing station 25c, the platen may support a polishing pad 34 having a generally smooth surface 272 and a single soft layer 274. Layer 274 may be attached to platen 30 by a pressure-sensitive adhesive layer 278. Layer 274 may be composed of a napped poromeric synthetic material. A suitable soft polishing pad is available from Rodel, Inc., under the trade name Polytex. Polishing pads 32 and 34 may be embossed or stamped with a pattern to improve distribution of slurry across the face of the substrate. Polishing station 25c may otherwise be identical to polishing station 25b. A transparent window 279 may be formed in polishing pad 34 over aperture 36.

Although the CMP apparatus is described a vacuum chucking the polishing sheet to the platen, other techniques could be used to secure the polishing sheet to the platen during polishing. For example, the edges of the polishing sheet could be clamped to the sides of the platen by a set of clamps.

Also, although the rollers are described as connected to the retainers by pins that are inserted through apertures, numerous other implantations are possible to rotatably connect the rollers to the platen. For example, a recess could be formed on the inner surface of the retainer to engage a pin that projects from the end face of the roller. The retainers 160 may be slightly bendable, and the rollers might be snap-fit into the retainers. Alternately, the recess in the inner surface of the retainer could form a labyrinth path that traps the rollers due to tension. Alternately, the retainer could be pivotally attached to the platen, and the roller could engage the retainer once the retainer is locked in position.

In addition, although the CMP apparatus is described as having one rectangular platen with a fixed-abrasive polishing sheet and two circular platens with standard polishing pads, other configurations are possible. For example, the apparatus can include one, two or three rectangular platens. In fact, one advantage of CMP apparatus 20 is that each platen base 170 is adaptable to receive either a rectangular platen or a circular platen. The polishing sheet on each rectangular platen may be a fixed abrasive or a non-fixed abrasive polishing material. Similarly, each polishing pad on the circular platen can be a fixed-abrasive or a non-fixed abrasive polishing material. The standard polishing pads can have a single hard layer (e.g., IC-1000), a single soft layer (e.g., as in a Polytex pad), or two stacked layers (e.g., as in a combined IC-1000/SUBA IV polishing pad). Different slurries and different polishing parameters, e.g., carrier head rotation rate, platen rotation rate, carrier head pressure, can be used at the different polishing stations.

One implementation of the CMP apparatus may include two rectangular platens with fixed-abrasive polishing sheets for primary polishing, and a circular platen with a soft polishing pad for buffing. The polishing parameters, pad composition and slurry composition can be selected so that the first polishing sheet has a faster polishing rate than the second polishing sheet.

Referring to FIGS. 12 and 13, in another implementation, at least one of the polishing stations, e.g., the first polishing station, includes a polishing cartridge 102' and a non-rotating platen 300. Polishing cartridge 102' includes a first roller or reel 130', a second roller or reel 132', and a generally linear sheet or belt 110' of polishing material, such as a fixed-abrasive polishing material. A first portion 120' of the polishing sheet is wrapped around the first roller 130', and a second portion 122' of the polishing sheet is wrapped around second roller 132'. An exposed portion 124' of the polishing sheet extends over the platen between the first and second rollers.

Four retainers 310 (shown in phantom in FIG. 13) are secured to table top 23 at the polishing station. Polishing cartridge 102' is detachably secured by retainers 310 to the table top. As discussed above, different implementations are possible to connect the polishing cartridge to the retainers. For example, the opposing end faces of rollers 130', 132' may engage support pins 312 that will rotatably connect the rollers to the associated retainers.

A drive mechanism 320 controls the rotation of the rollers 130' and 132'. The drive mechanism 320 can include two motors 322. One motor rotates first roller 130', and the other motor rotates second roller 132'. Each roller can be driven by its associated motor 322 in its respective take-up direction. It should be noted that as the polishing sheet is wound on the take-up roller, the effective diameter of the roller changes, thereby changing the take-up speed of that roller (assuming the roller rotates at a constant angular velocity). By driving one roller at a time in its respective take-up direction, the polishing sheet remains in tension, independent of the effective diameter of the take-up roller. Of course, many other drive mechanisms are possible. For example, with a more complex drive mechanism, both rollers could be driven by a single motor.

During polishing, polishing sheet 110' is driven linearly across the exposed portion of the substrate by drive mechanism 320 to provide relative motion between the substrate and the polishing sheet. As shown in FIG. 14A, the polishing sheet is initially driven (as shown by arrow "C") from first roller 130' to second roller 132'. Specifically, the polishing sheet unwinds from first roller 130', moves across the top surface of the platen, and is taken up by second roller 132'. As shown in FIG. 14B, once first roller 130' is empty and second roller 132' is full, the polishing sheet reverses direction, and the polishing sheet is driven (as shown by arrow "D") from second roller 132' to first roller 130'. Specifically, the polishing sheet unwinds from second roller 132', moves across the top surface of the rectangular platen, and is taken up by first roller 130'. Once first roller 130' is full and second roller 132' is empty, the polishing sheet reverses direction again, and is driven from first roller 130' to second roller 132'. In sum, the polishing sheet is driven alternately in one direction, and then in the reverse direction, until polishing of the substrate is complete.

The appropriate speed of the polishing sheet will depend on the desired polishing rate and the polishing sheet properties, but should be on the order of about one meter/second. The driving motor 322 may decelerate when a roller is nearly empty to prevent the polishing sheet from breaking under excessive stress. In addition, when the polishing sheet reverses direction, the motor will accelerate to bring the polishing sheet up to the desired polishing speed. Therefore, the speed of the polishing sheet will not necessarily be uniform.

Returning to FIGS. 12 and 13, platen 300 includes a generally planar rectangular top surface 302. A plurality of passages 304 (shown in phantom in FIG. 12) are formed through platen 300. A fluid supply line 306 connects passages 304 to a fluid source 308. During polishing, fluid is forced through passages 304 into a gap 309 between the top surface of the platen and the polishing sheet to form a fluid bearing therebetween. This fluid bearing helps ensure that the polishing sheet does not become abraded or stuck to the platen during polishing. In addition, if apertures or holes are formed in the polishing sheet, one of the passages can be used to inject a polishing fluid, e.g., a mixture of chemicals to aid the polishing process, through the holes in the polishing sheet and between the substrate surface and the polishing sheet.

The platen 300 may be vertically movable to adjust the pressure of the polishing sheet against the substrate. An actuator 330, such as a pneumatic actuator or a pressurizable bellows, may connect platen 300 to the table top of the CMP apparatus to raise and lower the platen as necessary.

Referring to FIGS. 15 and 16, in another implementation, at least one polishing station, e.g., the first polishing station, includes a first polishing cartridge 350, a second polishing cartridge 360, and a rotatable rectangular platen 370. The first polishing cartridge 350 includes a first roller or reel 352, a second roller or reel 354, and a generally linear sheet or belt 356 constructed of, for example, a fixed-abrasive polishing material. Similarly, second polishing cartridge 360 includes a first roller or reel 362, a second roller or reel 364, and a generally linear sheet or belt 366 constructed of, for example, a fixed-abrasive polishing material. The polishing sheets 356, 366 may be constructed of the same polishing material or different polishing materials.

The polishing cartridges 350, 360 can be mounted on platen 370 with retainers 371 so that the exposed portions of polishing sheets 356, 366 are arranged in two parallel coplanar strips separated by a relatively narrow gap 372. During polishing, platen 370 is rotated to create relative motion between the substrate and the polishing sheets (the area swept by substrate 10 during polishing is shown by phantom line 379). Between polishing operations, the polishing sheets are advanced incrementally to expose an unused portion of the polishing sheet. The polishing sheets 356, 366 can be advanced incrementally in the same direction, or in opposite directions.

Two grooves 376 (shown in phantom in FIG. 15) are formed in a top surface 378 of platen 370. Each groove forms a generally rectangular pattern, with one polishing sheet overlying each groove. Both grooves are connected to a vacuum source to vacuum chuck their respective polishing sheets to the platen.

An elongated transparent window 374 is formed in platen 370 and aligned with the gap between polishing sheets 356 and 366. The optical monitoring system can direct a light beam through window 374 and gap 372 to impinge the substrate being polished. An advantage of this implementation is that does not require a polishing sheet having a transparent stripe.

Referring to FIG. 17A, in another implementation, at least one polishing station, e.g., the first polishing station, includes a first polishing cartridge 350' and a second polishing cartridge 360' mounted to the machine base over a non-rotating platen 370'. The first polishing cartridge 350' includes a first roller or reel 352', a second roller or reel 354', and a generally linear sheet or belt 356' of a fixed-abrasive polishing material. Similarly, second polishing cartridge 360' includes a first roller or reel 362', a second roller or reel 364', and a generally linear sheet or belt 366' of a fixed-abrasive polishing material. The exposed portions of polishing sheets 356', 366' are arranged in two parallel coplanar strips separated by a relatively narrow gap 372'. Substrate 10 (shown in phantom) is positioned to overlie both polishing sheets 354', 364'.

Referring to FIG. 18, platen 370' includes a first fluid bearing surface 380 underlying first polishing sheet 356', a second fluid bearing surface 382 underlying second polishing sheet 366', and a channel 384 (shown in phantom in FIG. 17) separating the bearing surfaces. In addition, channels 385 may be formed along the outer edges of the bearing surfaces. During polishing, the polishing liquids will flow off the edges of the polishing sheets and into channels 384 and 385. Passages 388 extends through platen 380 to provide drainage of the polishing liquid from channels 384 and 385 via an outlet 387. A transparent window 386 positioned in channel 384 provides a viewing port for optical monitoring system 90'. Specifically, optical monitoring system 90' can direct a light beam 92' through window 386 and gap 372' to impinge the surface of the substrate being polished. Window 386 should project above the bottom of channel 384, but not above bearing surfaces 380 and 382. Thus, the window provides a substantially unblocked view of the bottom surface of the substrate during polishing. In addition, passages 390 are formed through platen 370'. A fluid source 391 is coupled to passages 390 to inject fluid between the bearing surfaces and the lower surface of the polishing sheets.

Returning to FIG. 17A, during polishing, the polishing sheets 354', 364' are driven alternately in one direction and then in the reverse direction. Specifically, a first pair of motors 392 and 394 can drive the first pair of rollers 352' and 362', respectively, and a second pair of motors 396 and 398 can drive the second pair of rollers 354' and 364'. The polishing sheets 354' and 364' can be driven by motors 392, 394 and 396, 398, in opposite directions (as shown by arrows E and F, respectively). The substrate can be rotated and/or oscillated laterally at a relatively low speed in order to avoid a low removal rate in the region of the substrate overlying the gap.

Alternately, referring to FIG. 17B, polishing sheets 354', 364' can be driven in the same direction (as shown by arrows G and H, respectively). In this case, rollers 352", 362" can be rotationally coupled, e.g., by a drive shaft 358. Similarly, rollers 354", 364" can be rotationally coupled, e.g., by a drive shaft 368. A first motor 392' can drive rollers 352", 362", and a second motor 396' can drive rollers 354", 364". Thus, both polishing sheets would move in the same direction and at the same speed. In addition, each pair of rollers could be replaced by a single roller that carries the two separate polishing sheets. In this case, the central retainer could be eliminated.

Referring to FIG. 19A, in yet another implementation, at least one of the polishing stations, e.g., the first polishing station, includes an inner polishing cartridge 400 and two outer polishing cartridges 410. The inner polishing cartridge 400 includes a first roller or reel 402, a second roller or reel 404, and a generally linear sheet or belt 406 of a fixed-abrasive polishing material. Similarly, each outer polishing cartridge 410 includes a first roller or reel 412, a second roller or reel 414, and a generally linear sheet or belt 416 of a fixed-abrasive polishing material. The inner and outer polishing sheets 406, 416 are arranged in three substantially parallel strips, each strip separated by a relatively narrow gap 420. The optical monitoring system may direct a light beam onto the surface of substrate through one of the gaps between the polishing sheets. The rollers 412, 414 of outer cartridge 410 are positioned in a rectangular configuration. In addition, the rollers 402, 404 of central cartridge 400 are spaced further apart than the rollers of the outer cartridges. Consequently, the exposed portion of central polishing sheet 406 is longer than the exposed portion of either outer polishing sheet 416.

As shown in FIG. 19A, the polishing cartridges can be mounted to a rotatable platen 430 (similar to the implementation shown in FIGS. 15 and 16), and the polishing sheets can be moved incrementally between polishing operations. The drive systems for the cartridges are not shown, but could be similar that illustrated in the implementation of FIGS. 3A-7. As the platen rotates, substrate 10 sweeps over a path (shown by phantom line 432) that covers each of the polishing sheets. The staggered position of the rollers reduces the diagonal length of the rotatable platen, thereby reducing the radius of the circle (shown by phantom line 434) swept by the platen and using space more efficiently.

Alternately, as shown in FIG. 19B, the polishing cartridges can be mounted to the machine base over a non-rotating platen 430' (similar to the implementation shown in FIGS. 17A and 18), and the polishing sheets can be moved continuously during polishing. Central polishing sheet 406' can be driven by a pair of motors 408, whereas outer polishing sheets 416' can be driven two pairs of motors 418. Each polishing sheet can be driven alternately in one direction by one of the motors, and then in the opposite direction by the other motor. Of course, if outer polishing sheets 416' are to be driven in the same direction, the outer rollers 412' and 414' can have common drive shafts. In this case, the outer polishing sheets can be driven by a single pair of motors. Substrate 10 is positioned to overlie at least two, and preferably all three, polishing sheets. The substrate can be rotated and/or oscillated laterally at a relatively low speed in order to avoid a low removal rate in the region of the substrate overlying the gaps.

In the implementation of FIG. 19B, the central polishing sheet can be driven in the opposite direction as the outer polishing sheets (as shown by arrows I and J, respectively). In fact, the three polishing sheets can be driven to reduce or substantially eliminate (as compared to a conventional rotating or linear polishing system) the total lateral force, i.e., the force in the plane of the substrate, on the substrate. Specifically, if the central and outer polishing sheets are driven at substantially the same speed but opposite directions, and if the surface area 424 of the substrate contacting the outer polishing sheets is substantially equal to the surface area 422 of the substrate contacting the central polishing sheet, the frictional forces applied to the substrate will substantially cancel each other. As a result, the total lateral force on the substrate is reduced or substantially eliminated, without creating a significant torque on the substrate. This should decrease the load of the substrate against the retaining ring, thereby reducing substrate deformation and improving polishing uniformity. If surface area 422 is greater or less than surface area 424, the relative speeds of the polishing sheets can be adjusted so that the total lateral force is substantially reduced.

In addition, the polishing sheets can be driven at different speeds to adjust the relative polishing rates at different portions of the substrate. The center and outer polishing sheets can be driven in opposite directions, or all the polishing sheets can be driven in the same direction, or the two outer polishing sheets can be driven in opposite directions (one of which will match the direction of the center polishing sheet).

The invention is not limited to the embodiments depicted and described. Rather, the scope of the invention is defined by the appended claims.

What is claimed is:

1. An assembly, comprising:
   at least one circular platen top configured to connect to a rotatable platen base with one or more connectors;
   at least one rectangular platen top configured to connect to the rotatable platen base with one or more connectors;
   one or more connectors, where each connector is configured to connect the at least one circular platen top or the at least one rectangular platen top to the rotatable platen base; and
   a rotatable platen base, the platen base being adaptable to receive either of the circular platen top and the rectangular platen top and connect thereto with one or more connectors.

2. The assembly of claim 1, further comprising a generally linear polishing sheet secured to the rectangular platen top.

3. The assembly of claim 2, wherein the linear polishing sheet extends between a feed roller and a take-up roller connected to the rectangular platen top.

4. The assembly of claim 2, further comprising a drive mechanism to advance the polishing sheet in a linear direction across a top surface of the rectangular platen top.

5. The assembly of claim 1, wherein the linear polishing sheet is a fixed-abrasive material.

6. The assembly of claim 1, further comprising a generally circular polishing sheet secured to the circular platen top.

7. The assembly of claim 6, wherein the circular polishing sheet is a non-fixed-abrasive material.

8. The assembly of claim 1, wherein each of the one or more connectors comprises a screw.

* * * * *